United States Patent [19]

Hsu

[11] Patent Number: 5,516,717

[45] Date of Patent: May 14, 1996

[54] METHOD FOR MANUFACTURING ELECTROSTATIC DISCHARGE DEVICES

[75] Inventor: Chen-Chung Hsu, Taichung, Taiwan

[73] Assignee: United Microelectronics Corporation, Hsinchu, Taiwan

[21] Appl. No.: 424,887

[22] Filed: Apr. 19, 1995

[51] Int. Cl.6 .......................... H01L 21/70; H01L 27/00; H01L 21/44; H01L 23/02
[52] U.S. Cl. .............................. 437/56; 437/51; 437/192; 437/193; 257/355
[58] Field of Search ................................. 437/51, 56, 39, 437/192, 193; 257/355, 356, 357, 358, 359, 360, 361, 362, 363

[56] References Cited

U.S. PATENT DOCUMENTS

| 4,503,448 | 3/1985 | Miyasaka | 257/363 |
|---|---|---|---|
| 4,992,844 | 2/1991 | Yakushiji | 257/355 |
| 5,087,579 | 2/1992 | Tomassetti | 437/56 |
| 5,248,892 | 9/1993 | Van Roozendaal et al. | 257/361 |
| 5,364,801 | 11/1994 | Smayling et al. | 437/39 |
| 5,449,939 | 9/1995 | Horiguchi et al. | 257/363 |

Primary Examiner—George Fourson
Assistant Examiner—Brian K. Dutton
Attorney, Agent, or Firm—Ladas & Parry

[57] ABSTRACT

A method for manufacturing electrostatic discharge (ESD) devices on a silicon substrate. The method is consistent with fabricating an integrated circuit having a buried contact structure. By modifying photolithographic masks, the ESD device and the buried contact are formed on the silicon substrate at the same time. Without any extra processing steps, the manufacturing of the ESD device is simplified thus reducing the manufacturing cost.

9 Claims, 6 Drawing Sheets

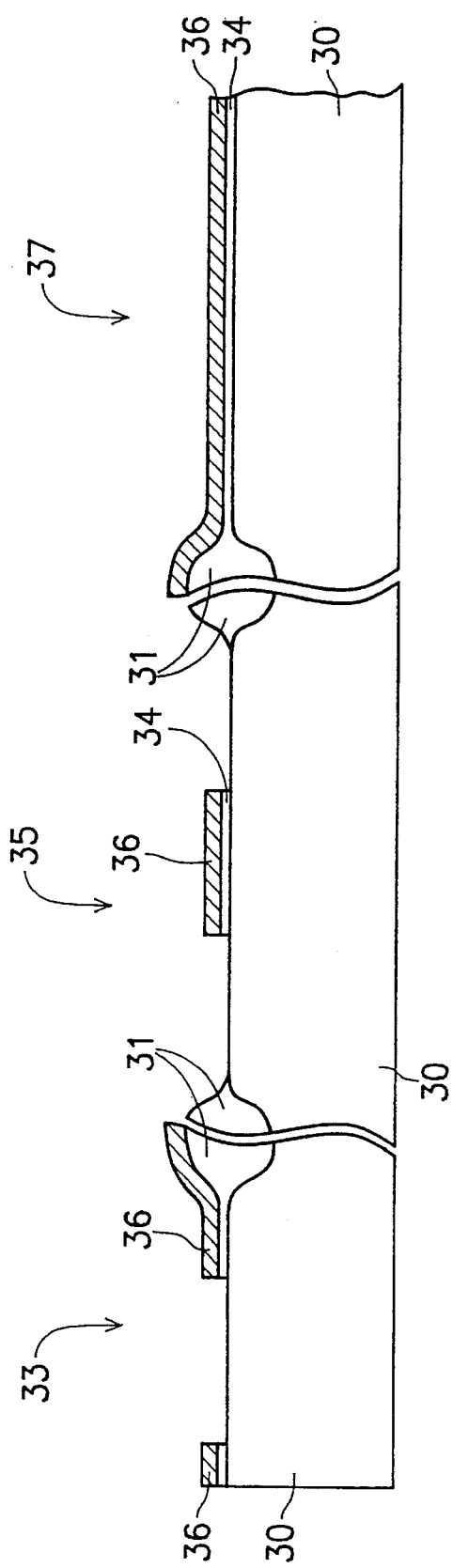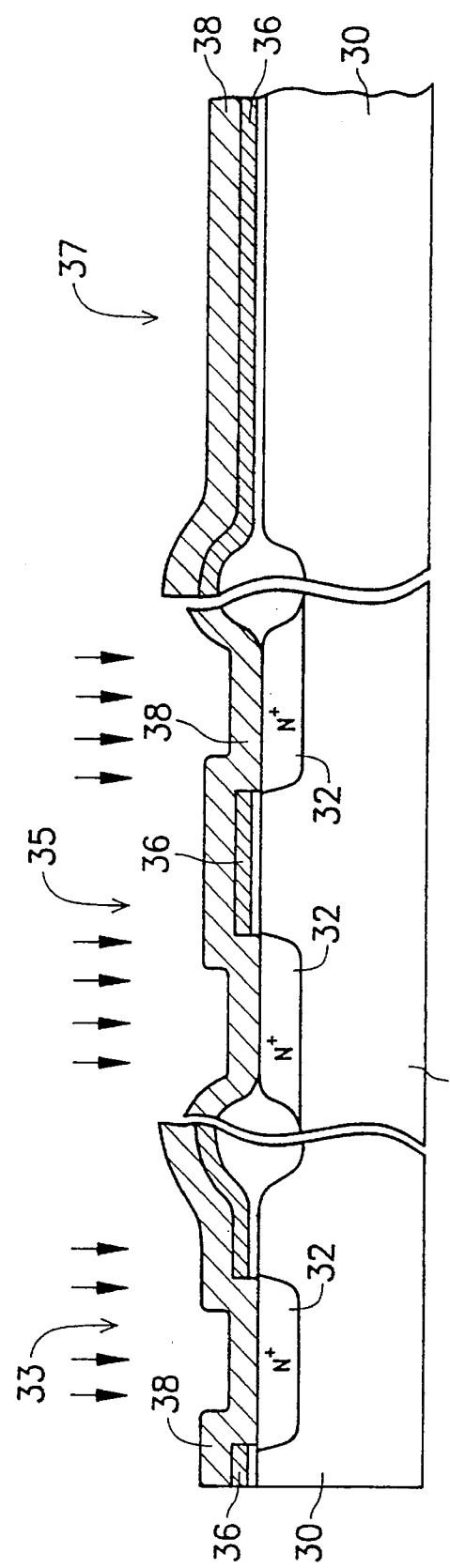

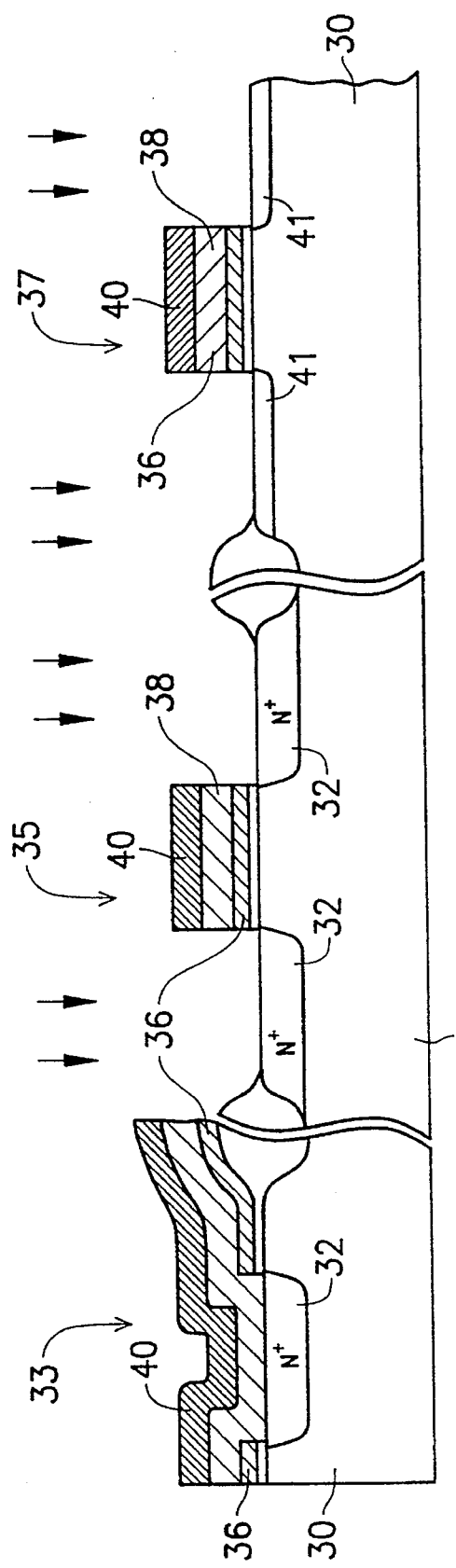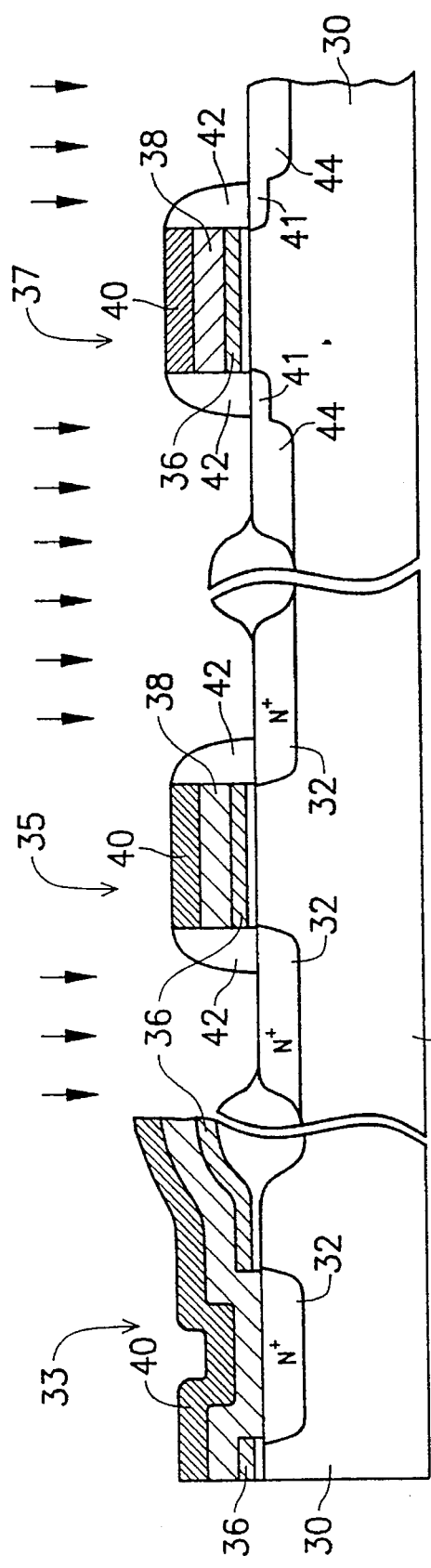

METHOD FOR MANUFACTURING ELECTROSTATIC DISCHARGE DEVICES

FIELD OF THE INVENTION

The present invention relates to the manufacturing of electrostatic discharge (ESD) devices on a semiconductor substrate, and more particularly to a method of manufacturing ESD devices compatible with processing a semiconductor integrated circuit having a buried contact structure.

BACKGROUND OF THE INVENTION

In order to protect an integrated circuit (IC) from external electrostatic voltage and current that might damage its internal devices, ESD protection devices are placed at the input and/or output terminals of the integrated circuit. An ESD device is characterized by having source and drain regions that are provided with large current flow capacity to discharge high electrostatic voltage buildup. The ESD device also has deep or wide junctions between its source/drain and substrate for dissipating heat caused by the large amount of electrostatic current flow.

Since a conventional lightly-doped drain (LDD) MOS transistor is designed to suppress the hot electron effect, its channel current capacity is too small to satisfy the requirements of an ESD device. Further, the areas of drain-substrate and source-substrate junctions of an LDD MOS transistor are not large enough to dissipate the heat from the electrostatic discharge. Therefore a double-diffused drain (DDD) MOS transistor, which has larger channel current capacity and broader areas of source-substrate an drain-substrate junctions than those of LDD MOS transistors, is appealing as an ESD device.

In the past, integrated circuits with ESD protection devices employing LDD MOS transistors have utilized an additional mask step and an additional ion implanting step to increase the doping concentration of the source and drain regions of the LDD MOS transistors that are designed to be ESD devices. The additional ion implantation can be performed before or during the formation of the LDD MOS transistors. However, these further processing steps make the manufacturing process for the integrated circuit very complicated.

FIG. 1A through FIG. 1C are cross-sectional views illustrating the process for forming a DDD MOS ESD device on a silicon substrate 10 during the formation of the LDD MOS transistor. The left hand portions of the drawings depict the regions of LDD MOS transistors, while the right hand portions depict the DDD MOS regions for ESD devices. Referring to FIG. 1A, according to a conventional LDD MOS transistor process, lightly doped regions 12 are formed by ion implanting silicon substrate 10 after sequentially forming a dielectric layer 14 and gate electrodes 15 and 16.

Referring next to FIG. 1B, another dielectric layer is deposited over the structure of FIG. 1A and immediately etched back to leave spacers 18 around gate electrode 15. However, gate electrode 16 in the ESD device region can not be surrounded by spacers for the purpose of forming an ESD device. Therefore a further step of mask protection of the LDD MOS region followed by an etching back step to remove the spacers and dielectric layer 14 in the ESD device region are performed.

The structure of FIG. 1B is then subjected to ion implantation step to form heavily doped regions 19 in silicon substrate 10, as shown in FIG. 1C. The MOS transistor formed in the left hand portion of FIG. 1C has a LDD structure due to the shielding effect of spacers 18. At the same time, due to the absence of spacers around gate electrode 16, the transistor in the right hand portion of FIG. 1C has source and drain regions with double diffused structures, and is provided with ESD properties.

Another example, as shown in cross-sectional views from FIG. 2A to FIG. 2C, forms the DDD MOS ESD structure prior to the formation of the LDD structure. There are also two portions in the drawings to show the LDD MOS region and ESD device region respectively.

Referring to FIG. 2A, an ion implantation step is performed to form lightly doped regions 22 in a silicon substrate 20 after the formation of a dielectric layer 24 and gate electrodes 25 and 26. Instead of forming spacers around gate electrode 25, an additional photoresist mask 28 is formed over the LDD MOS region, which serves as an ion implantation barrier layer, as is shown in FIG. 2B. The process is continued by performing an ion implantation step to form heavily doped source and drain regions 29 in silicon substrate 20, as illustrated in the right hand portion of FIG. 2C. The DDD structure is thus formed in the ESD device region after this ion implantation step. After removing photoresist mask 28, the process goes on according to the conventional LDD manufacturing steps and thus its description and drawings are omitted here.

Note that at least one additional mask and one extra ion implantation step are necessary in the above mentioned process flows for forming the DDD MOS ESD device. As a matter of fact, in a well-established integrated circuit processing sequence, the addition of any supplementary steps will severely affect the consistency of the products, thus increasing the manufacturing cost.

SUMMARY OF THE INVENTION

The present invention provides a method for forming ESD devices compatible with processing a semiconductor integrated circuit without any extra processing steps.

The invention provides a method for forming ESD devices at a lower manufacturing cost compared to the prior art.

Briefly, and in general terms, the present invention provides an integrated circuit process that yields a buried contact structure and fabricates ESD devices and preferably permits all other devices to be fabricated at the same time. During the formation of the buried contact, the mask that defines contact windows is modified.

The process comprises: forming a field oxide layer on a silicon substrate to define device regions; forming a dielectric layer overlying the device regions; forming a first polysilicon overlying the dielectric layer; patterning and etching back the first polysilicon layer and the dielectric layer to expose contact windows in a buried contact region and source/drain regions in an ESD device region; forming a second polysilicon layer overlying the structure; ion implanting the structure to increase the conductivity of the second polysilicon layer and to form diffusion regions in the silicon substrate of the contact windows and source/drain regions; annealing the structure to activate impurities in the diffusion regions; depositing a tungsten silicide layer overlying the second polysilicon layer; patterning and etching back the tungsten silicide layer and the second polysilicon layer to form a gate electrode in the ESD device region; and forming sidewall spacers around the gate electrode.

BRIEF DESCRIPTION OF THE DRAWINGS

Other objects, features and advantages of the present invention will become apparent by the following detailed description of the preferred, but non-limiting embodiment, with reference to accompanied drawings, wherein:

FIGS. 3A through 3F illustrate, in cross section, the process steps in accordance with the preferred embodiment of the present invention.

DETAILED DESCRIPTION OF THE INVENTION

Figure 1A:
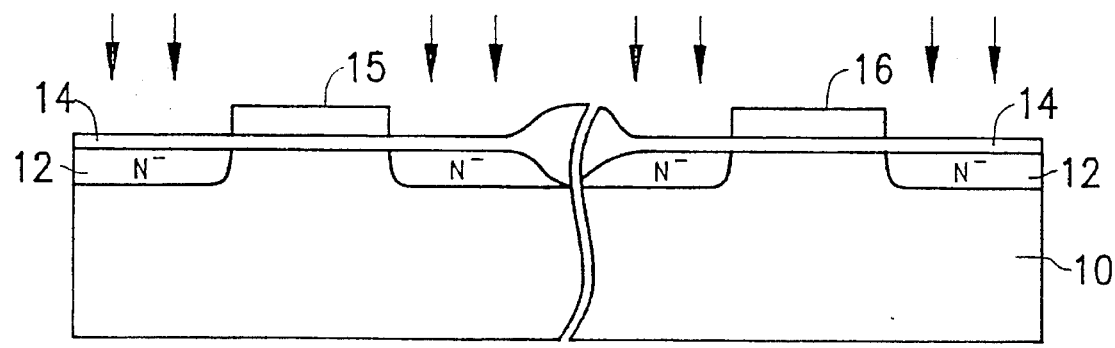
FIGS. 1A through 1C illustrate, in cross section, the process steps according to the prior art.
Figure 1B:
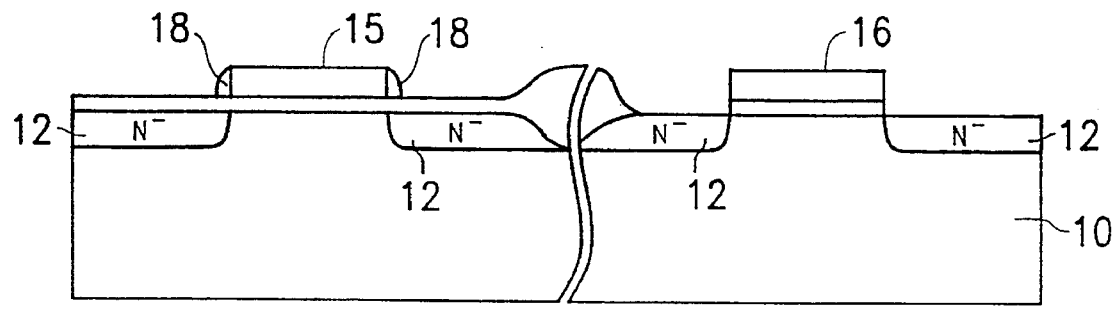
Figure 1C:
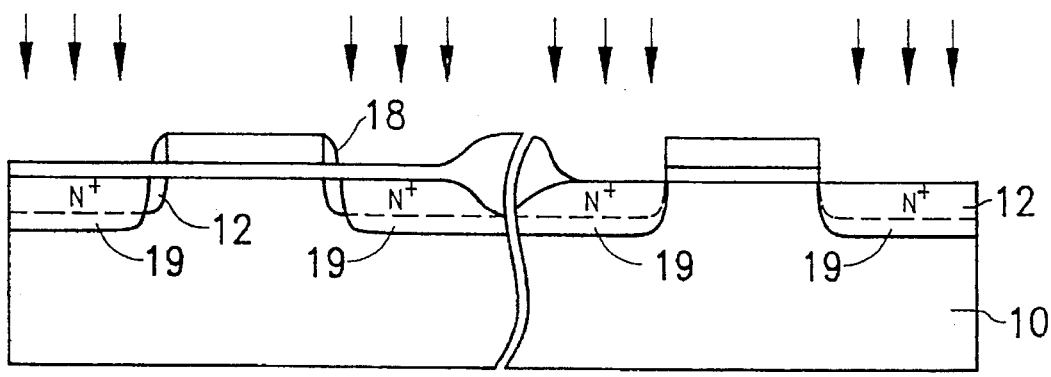

FIGS. 3A through 3F illustrate, in cross section, the process steps of the preferred embodiment of the present invention. A buried contact region is shown in the left hand portions of the drawings, while an ESD region and an LDD MOS device region are depicted in the central portions and right hand portions of the drawings respectively.

Referring to FIG. 3A, a field oxide layer 31 is formed on a silicon substrate 30 to define device regions, such as a buried contact region 33, an ESD region 35 and an LDD MOS device region 37. A dielectric layer 34 and a conducting layer 36 are subsequently formed over the structure and then patterned and etched back to expose buried contact windows in the buried contact region 33 and source/drain regions of the ESD region 35. This is achieved by including patterns for ESD device gate electrodes 36 in the original mask for the buried contact windows. Dielectric layer 34 can be silicon dioxide having a thickness of approximately a few hundreds of Angstroms. Conducting layer 36 which may be formed, for example by chemical vapor deposition (CVD), upon dielectric layer 34 can be polysilicon having a thickness of about 800 Å. The remaining portion of dielectric layer 34 and conducting layer 36 in the ESD region 35 form a gate electrode 36 which has a length of about 1.2 to 1.5μm.

Figure 2A:
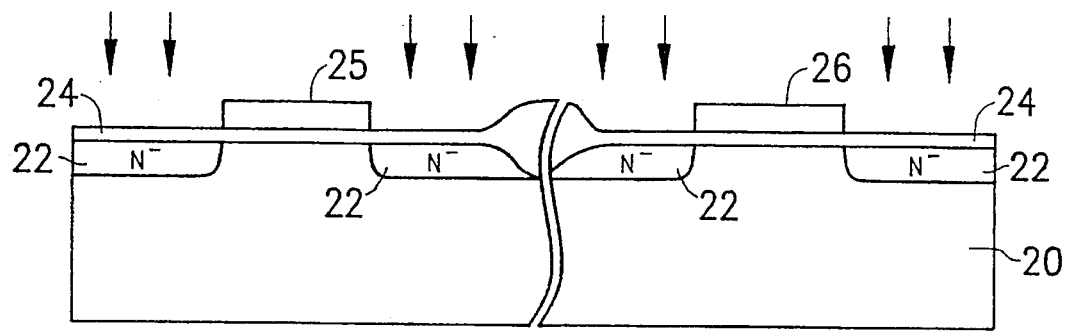
FIGS. 2A through 2C illustrate, in cross section, alternative process steps according to the prior art.
Figure 2B:
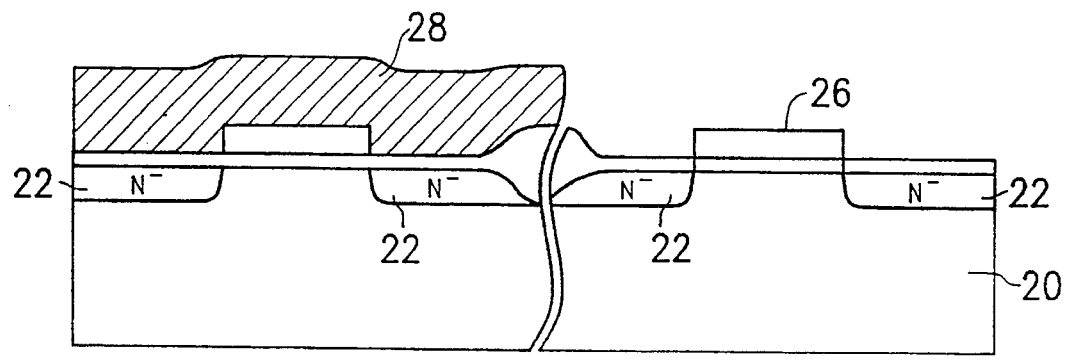
Figure 2C:
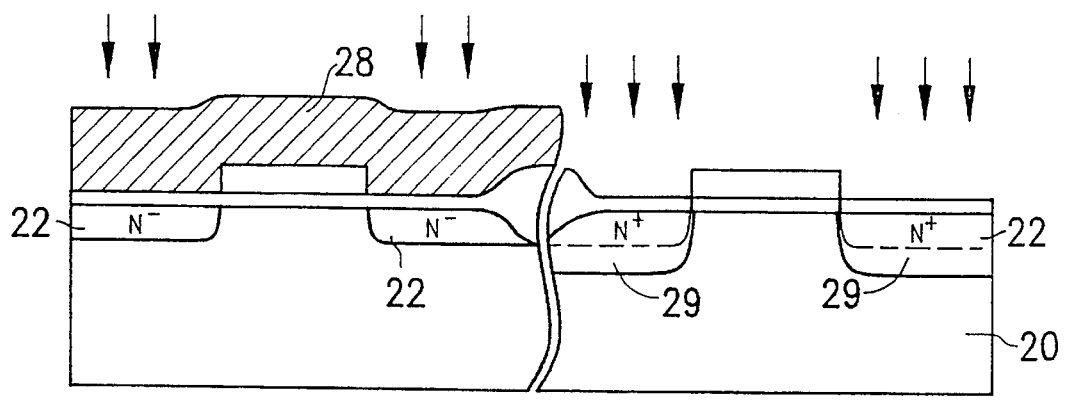
Figure 10:
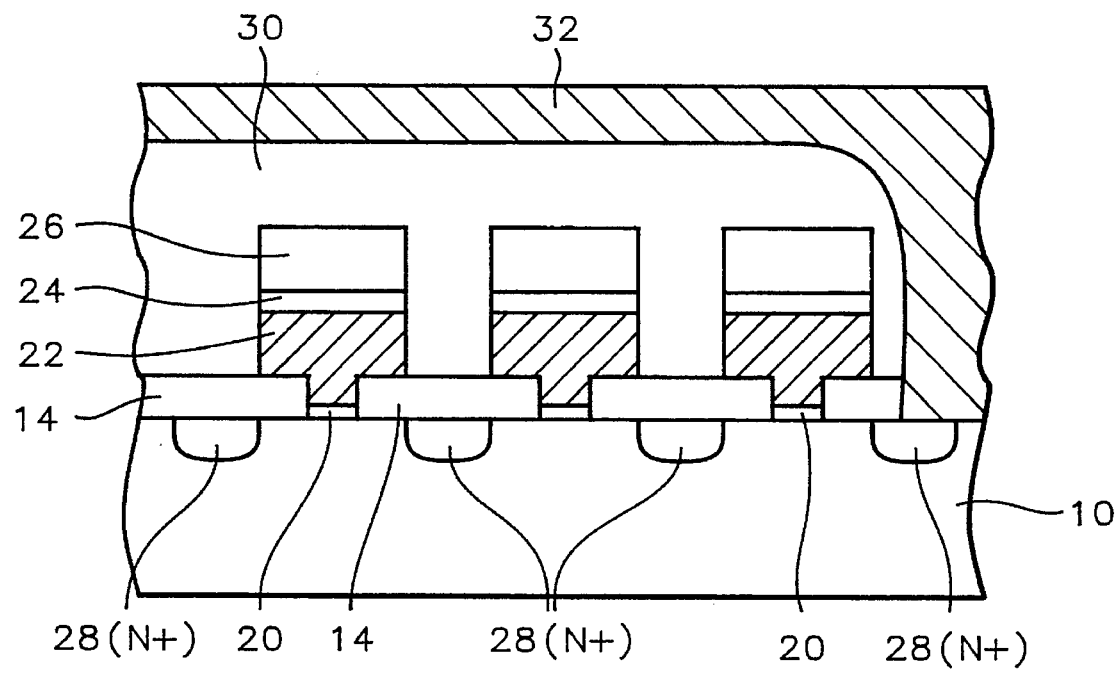
Figure 11:
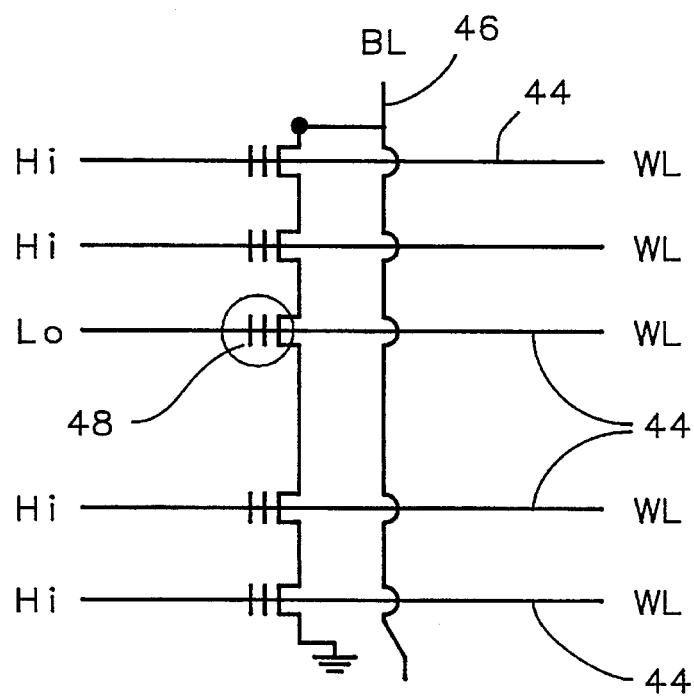

Referring next to FIG. 3B, a second conducting layer 38 is deposited over the structure depicted in FIG. 2A. Second conducting layer 38 is preferably a layer of polysilicon, deposited by CVD to a thickness of about 1500 Å. Then the structure is ion implanted to increase the conductivity of polysilicon layer 38 and to form diffusion regions 32 in silicon substrate 30 at the same time. The ion implantation step is preferably performed, for example, by implanting phosphorus (P) ions with a dosage of about $8E15/cm^2$ and an implanting energy of about 50 KeV. Diffusion regions 32 in the ESD region 35 form heavily doped source/drain regions that can discharge high ESD buildup. Diffusion region 32 in the buried contact region 33 makes electrical contact with polysilicon layer 38.

The process is continued by annealing the structure to activate the implanted impurities in diffusion regions 32. Referring to FIG. 3C, a tungsten silicide ($WSi_x$) layer 40 is deposited upon the structure to overlie polysilicon layer 38. Tungsten silicide layer 40 has a thickness of about 1500 Å.

By patterning and etching back tungsten silicide layer 40 and polysilicon layer 38, as shown in FIG. 3D, gate electrode structures in the ESD device region 35 and LDD MOS device region 37 are formed.

To establish lightly doped source/drain regions 41 in LDD MOS device region 37, a second ion implantation step is carried out, for example, by implanting P ions with a dosage of about $3E13/cm^2$ and an implanting energy of about 50 KeV, or with an implanting energy of about 60 KeV for 30 degree tilted. This ion implantation step, as shown in FIG. 3E, will not alter the properties of ESD devices, since the dosage in source/drain diffusion regions 32 is too high to be affected.

Further referring to FIG. 3F, a dielectric layer, such as silicon dioxide, is deposited over the structure and then etched back to leave sidewall spacers 42 around gate electrodes in ESD device region 35 and LDD MOS device region 37. Then a third ion implantation to form heavily doped source/drain regions of LDD devices is performed. The third ion implantation is carried on, for example, by implanting arsenic (As) ions with a dosage of about $5E15/cm^2$ and an implanting energy of about 80 KeV.

Figure 4:
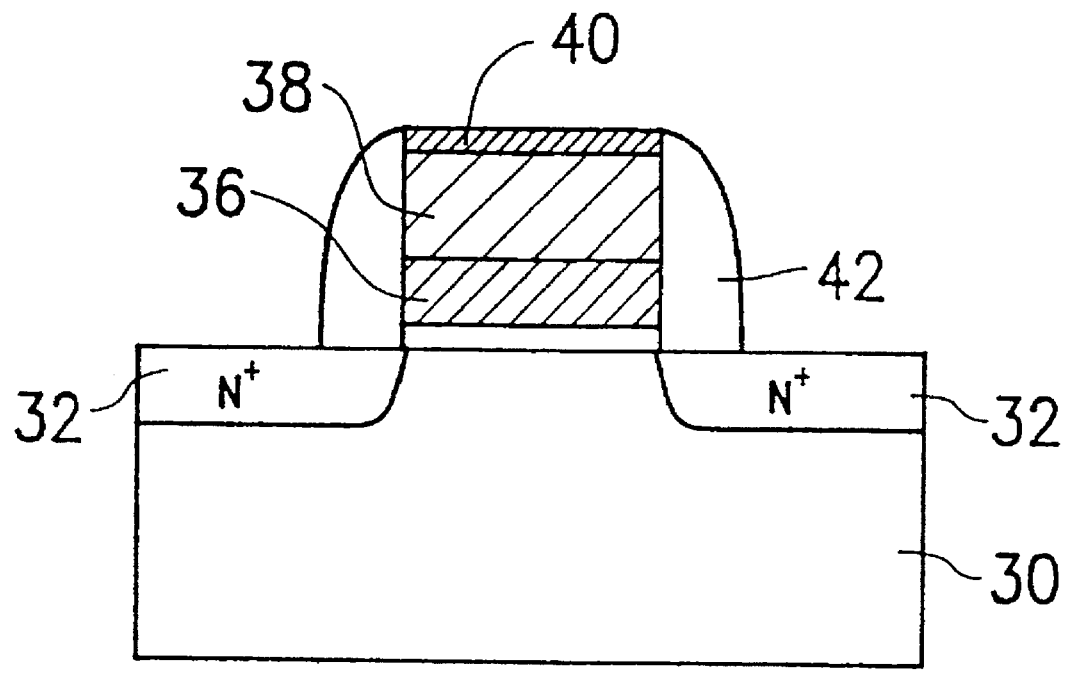
FIG. 4 illustrates, in cross section, an ESD device structure fabricated according to the method of the preferred embodiment.

The ESD device fabricated according to the above preferred embodiment is shown, in cross section, in FIG. 4. Source and drain regions 32 of the ESD structure have deep junction depths through the multiple ion implantation steps that are necessary for a conventional buried contact process. Therefore, in accordance with the preferred embodiment of the invention, the ESD device is compatible with the buried contact process without any extra steps thus reducing a great deal of manufacturing cost.

What is claimed is:

1. A method for forming an electrostatic discharge device on a silicon substrate, comprising the steps of:

forming a field oxide layer upon said silicon substrate to define a buried contact region, an electrostatic discharge region and a device region;

forming a dielectric layer overlying said buried contact region, said electrostatic discharge region, and said device region;

forming a first conducting layer overlying said dielectric layer;

patterning and etching said first conducting layer and said dielectric layer to form a contact window in said buried contact region and to expose source/drain regions in said electrostatic discharge region;

forming a second conducting layer overlying said buried contact region, said electrostatic discharge region, and said device region;

implanting ions to increase the conductivity of said first and second conducting layers and to form diffusion regions in said silicon substrate under said source/drain regions and said contact window;

forming a silicide layer overlying said second conducting layer; and patterning and etching said silicide layer and said first and second conducting layers to form gate electrodes in said electrostatic discharge region and said device region.

2. The method of claim 1, wherein said first conducting layer is a polysilicon layer having a thickness of about 800 Å.

3. The method of claim 1, wherein said second conducting layer is a polysilicon layer having a thickness of about 1500 Å.

4. The method of claim 1, wherein said step of implanting ion is carried out by implanting phosphorous ions with a dosage of about $8E15/cm^2$ and an implanting energy of about 50 KeV.

5. The method of claim 1, wherein said silicide layer is a tungsten silicide layer having a thickness of about 1500 Å.

6. The method of claim 1, further comprising a step to form spacers around said gate electrodes.

7. The method of claim 6, further comprising an ion implantation step which occurs prior to the formation of said spacers.

8. The method of claim 6, further comprising an ion implantation step which occurs after the formation of said spacers.

9. The method of claim 1, further comprising an annealing step to activate said diffusion regions prior to the formation of said silicide layer.

* * * * *